United States Patent [19]
Wells

[11] Patent Number: 5,408,098
[45] Date of Patent: Apr. 18, 1995

[54] METHOD AND APPARATUS FOR DETECTING LOW LOSS ELECTRONS IN A SCANNING ELECTRON MICROSCOPE

[75] Inventor: Oliver C. Wells, Yorktown Heights, N.Y.

[73] Assignee: International Business Machines Corporation, Armonk, N.Y.

[21] Appl. No.: 120,012

[22] Filed: Sep. 10, 1993

[51] Int. Cl.[6] .............................................. H01J 37/26
[52] U.S. Cl. ..................................... 250/310; 250/305
[58] Field of Search ........................ 250/305, 310, 397

[56] References Cited

U.S. PATENT DOCUMENTS

| | | | |
|---|---|---|---|
| 3,731,096 | 5/1973 | Carter | 250/310 |
| 4,179,604 | 12/1979 | Christou | 250/310 |
| 4,743,757 | 5/1988 | Coates | 250/310 |
| 4,962,306 | 10/1990 | Hodgson et al. | 250/310 |

*Primary Examiner*—Bruce C. Anderson
*Attorney, Agent, or Firm*—Sughrue, Mion, Zinn, Macpeak & Seas

[57] ABSTRACT

A detector system for a low-loss electron operated scanning electron microscope providing a focused primary electron beam and producing backscattered electrons having a plurality of energy levels by interactions with a specimen disposed within the primary electron beam includes a plurality of grids, each of the grids having a corresponding predetermined potential, wherein the grids selectively filter the backscattered electrons to permit collection of low loss electrons having at least a predetermined threshold energy level at an exit side of the grids, a focusing grid disposed opposing the exit side of the grids for focusing the low loss electrons to produce convergence of the low loss electrons in a convergence region and an electron detector located substantially within the convergence region for detecting the low loss electrons. Both the electron detector and the focusing grids are maintained at predetermined detector and focusing potentials, which can be made equal to one another. A method for producing a detector system for a SEM is also disclosed.

32 Claims, 6 Drawing Sheets

METHOD AND APPARATUS FOR DETECTING LOW LOSS ELECTRONS IN A SCANNING ELECTRON MICROSCOPE

DESCRIPTION

1. Technical Field

The present invention relates generally to a scanning electron microscope for examining surface features having dimensions which may be smaller than the wavelength of light. More specifically, the present invention relates to a method and an apparatus for detecting low loss electrons selected from the backscattered electrons produced by primary beam electrons striking a specimen. The method and apparatus advantageously provide increased low loss electron collection efficiency.

2. Background Art

The inspection of very small features, for example, semiconductor structures in microelectronic circuits, is critical to many industries. Charged particle testing is particularly suited to inspection of such structures since it can resolve features smaller than the wavelength of light. Electron microscopes have been known for many years and are suitable for nondestructive examination of features having dimensions generally in the Angstrom range.

A scanning electron microscope (SEM) is known in the art for providing good resolution and depth of field. SEMs have been used both for examining microcircuits and for exposing patterns in resist layers as part of a fabrication process. In general, a finely focused electron beam (primary beam) is directed onto a specimen or workpiece. An image is then formed on a cathode ray tube, in computer memory or other image recording or display device by scanning the display device and the primary beam in synchronism and by modulating the brightness of the display device with a signal that is obtained in some way from the specimen as it is scanned by the primary beam. Usually a certain percentage of electrons are scattered from the specimen causing a backscattered electron (BSE) signal. Some secondary electron emission can also be caused by the incidence of the primary beam. A SEM operated by secondary electron collection is disclosed in exemplary U.S. Pat. No. 3,474,245. Secondary electrons are focused onto an electron detector by means of one or more focusing grids at predetermined potentials. U.S. Pat. Nos. 4,442,355, 4,596,929 and 4,743,757 disclose focusing devices of this type. A combination of electric and magnetic fields are also used for focusing secondary electrons on detectors as disclosed, for example, in U.S. Pat. Nos. 4,658,136, 4,658,137 and 4,714,833.

It will be noted that the term "focused" is used in the preceding paragraph with two different meanings. With respect to the primary beam, the term "focused electron beam" denotes that the primary beam must be of a small diameter to localize the effect of the primary beam in a small region on the specimen or work piece to thereby improve the sharpness of the resultant image. With respect to electrons focused onto an electron detector, the term "focused" denotes that electrons must be collected in order to give the signal that is used to modulate the brightness of the scanning spot (or its equivalent) in the display device. In other words, focusing is related to the electron collection efficiency of the electron detection in that improvements in focusing result in increased electron collection efficiencies. The size of the collected or focused bundle of electrons in the latter case must be smaller than the active part of the collector. It will be noted that this does not refer to the sharpness of the recorded image. It is to the improvement in the focusing of electrons onto the active part of the collector that the present invention is directed.

Other information can also be extracted from the BSE or secondary electrons with or without forming an image of the surface features of the specimen. U.S. Pat. Nos. 3,646,344, 4,246,479, 4,355,232, 4,514,682 and 4,554,455, for example, each disclose an apparatus for determining surface potential distributions induced in the specimen due to interaction of the primary electron beam with the specimen. U.S. Pat. No. 4,220,853, on the other hand, discloses a method and apparatus for measurement of potential waveforms in electronic components.

In another technique for operation of a SEM, low loss electrons (LLE) are collected. LLE are generally those BSEs which occupy the upper end of the electron energy distribution curve. These LLEs typically are those electrons which have lost less than about 1% of the primary energy, as defined by the present inventor in Applied Physics Letters, Vol. 19, No. 7, page 232, Oct. 1, 1971. The upper limit on energy loss may exceed 1%, and in some cases, may have as much as about 25% energy loss or more. LLEs may also be characterized by a particular energy loss, e.g., a 200 eV loss, with respect to the primary beam in some instances. Low-loss images from a solid specimen have an information depth which is typically more shallow than 100 angstroms; the shallowness of the information depth being limited by the mean free path between inelastic scattering events. Images produced from LLEs exhibit strong topographic and electron channeling contrasts.

Two versions of the LLE operated SEM are known in the art. The first is the so called high resolution type in which the specimen is mounted in the condenser-objective lens or other type of internal focus lens. The specimen is mounted at an angle to the centerline of the primary electron beam in the high field region of the condenser-objective lens used to provide the focusing magnetic field and LLEs, which are deflected by the second half of the focusing lens field into an exit lens bore, are collected as defined by the present inventor and others in "Applied Physics Letters." Vol. 23, No. 6, page 353, Sep. 15, 1973. The high spatial resolution is provided because of the low aberration of the condenser-objective lens. U.S. Pat. No. 4,962,306 discloses a related way of energy-filtering the scattered electrons from a sample located as described above.

A second type of LLE operated SEM employs an external focus final lens together with a detector system including a plurality of charged grids, which act as an energy filter to permit electrons having at least a predetermined energy level (LLEs) to be detected, as defined by the present inventor in the 1971 reference cited above. U.S. Pat. No. 4,179,604 discloses a specific embodiment of the second type of LLE operated SEM.

Figure 1:
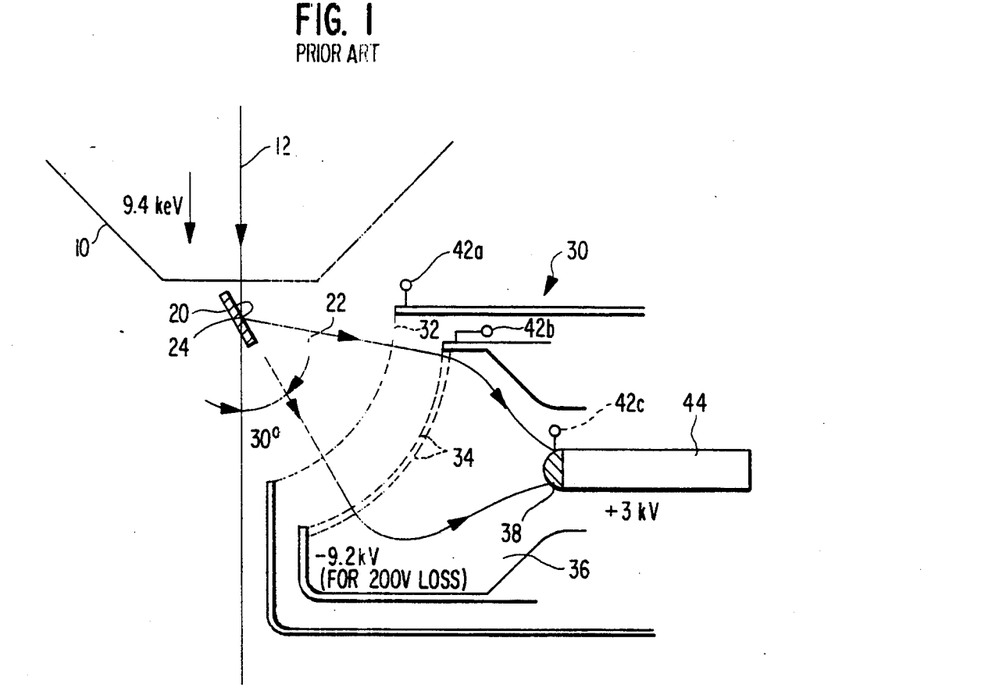
FIGS. 1 and 2 are illustrative diagrammatic views of a conventional scanning electron microscope.
Figure 2:
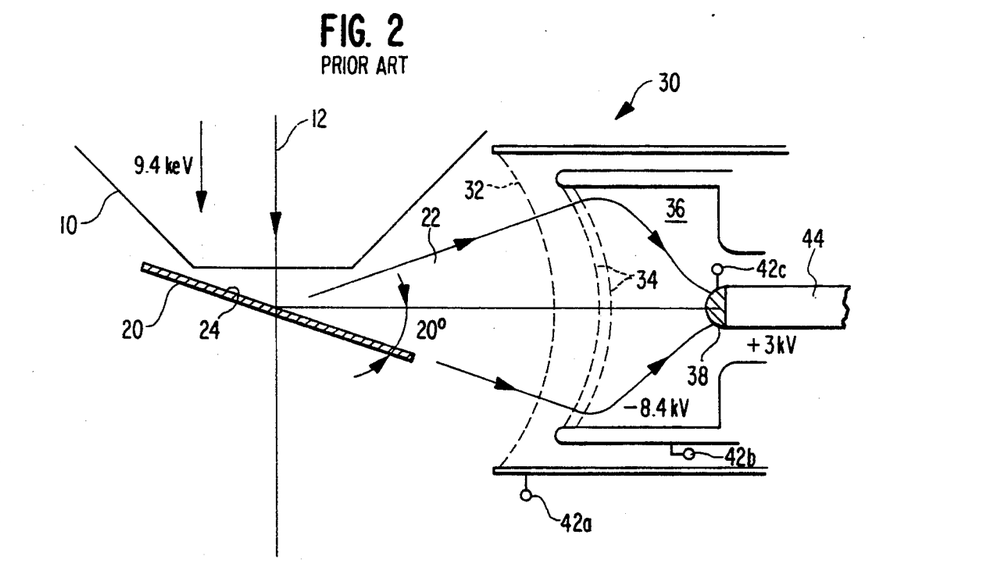

FIGS. 1 and 2 are illustrative diagrams of conventional LLE operated SEMs comprising an electron column of known design having a final magnetic focusing lens, shown in outline as element 10, providing a primary electron beam 12 having primary electrons of a predetermined energy level, a specimen 20 disposed in the beam 12 and positioned at a predetermined angle with respect to the beam 12 to provide a backscattered electron beam 22 subtending a large solid angle originating at a surface 24 of specimen 20 and an electron detector system 30 disposed to intersect beam 22 for collecting and detecting the electrons of beam 22 having energy levels above a predetermined threshold level. Detector system 30 typically includes a plurality of charged grids, e.g., an input grid 32 and at least one filter grid, generally denoted 34, which cooperatively provide an energy filter means for allowing passage or transmission of electrons having at least the predetermined threshold energy level into a cavity 36 of detector system 30. Preferably, grids 32, 34 are disposed substantially perpendicular to the axis of revolution of the solid angle formed by beam 22 and generally have a hemispherical configuration so that each of the electrons of beam 22 pass through grids 32, 34 on a trajectory substantially perpendicular to a grid surface. Electrons entering cavity 36 from the exit side of filter grid 34 are accelerated towards an electron detector 38, e.g., a scintillator 38, by a predetermined detector potential applied to electron detector 38, relative to grid 34. Preferably, electron detector 38 is connected to a conventional photomultiplier (not shown) via a conventional light guide 44.

It will be appreciated that grids 32 and 34 each have a corresponding potential applied and that the magnitude of these grid potentials determines the predetermined threshold energy level of the electrons entering the cavity 36. As disclosed at pages 106-107 of Wells, O. C. et al., *Scanning Electron Microscopy*, McGraw-Hill Book Company, New York, 1974, the grid potentials applied to grids 32 and 34 and the detector potential applied to electron detector 38 at connectors, generally denoted 42, advantageously can be controlled so that detector system 30 detects either secondary electrons or LLEs.

Figure 3:
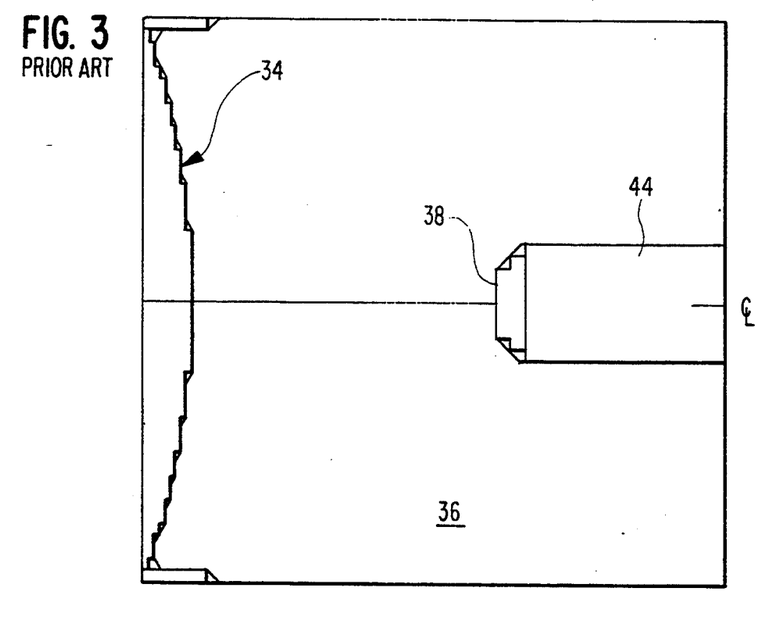
FIG. 3 is an illustrative expanded diagrammatic view of a section of the detector system of the conventional scanning electron microscope of FIG. 2.
Figure 4:
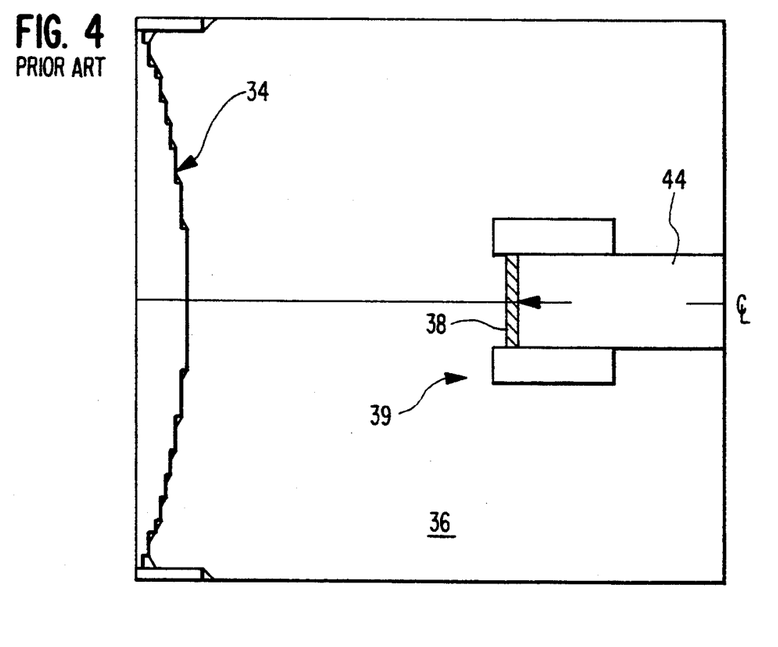
FIG. 4 is an illustrative expanded view of a variation of the detector system of the conventional scanning electron microscope of FIG. 2.

FIGS. 3 and 4 are expanded illustrative views of a section of detector system 30 encompassing filter grid 34, cavity 36 and electron detector 38. FIG. 3 shows a scintillator 38 of hemispherical shape as defined by T. E. Everhart and R. F. M. Thornley, "Journal of Scientific Instruments," Vol. 37, 246 (1960). FIG. 4 shows a flat scintillator 38 held onto a light guide 44 by a metallic ring 39 as defined by the present inventor in "The Review of Scientific Instruments," Vol. 41, No. 7, page 1034, July 1970. In FIG. 4, the detector potential advantageously is applied to metallic ring 39. Commonly assigned U.S. application Ser. No. 07/484,718, filed Feb. 23, 1990, discloses specific embodiments of scintillation detectors employing metallic rings.

Figure 5:
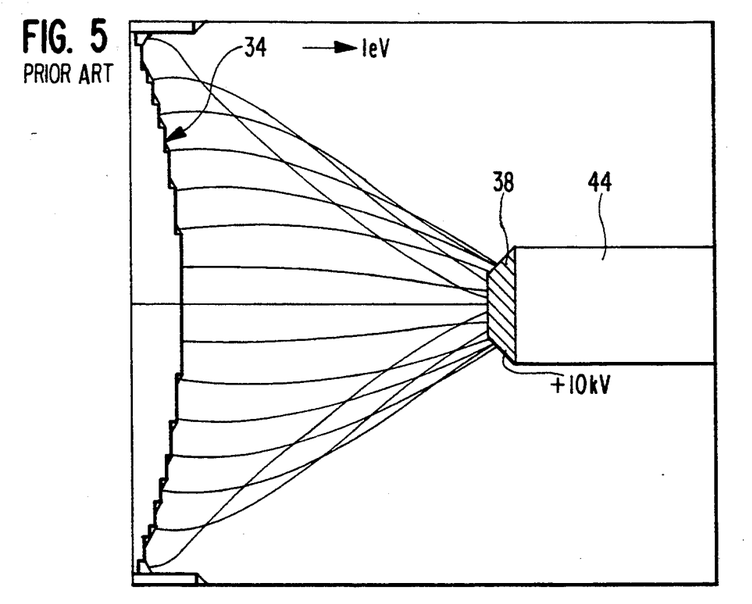
FIGS. 5-8 are illustrative calculated electron trajectories for electrons having different energies at the exit side of the filter grid traversing the detectors illustrated in FIGS. 3 and 4.
Figure 6:
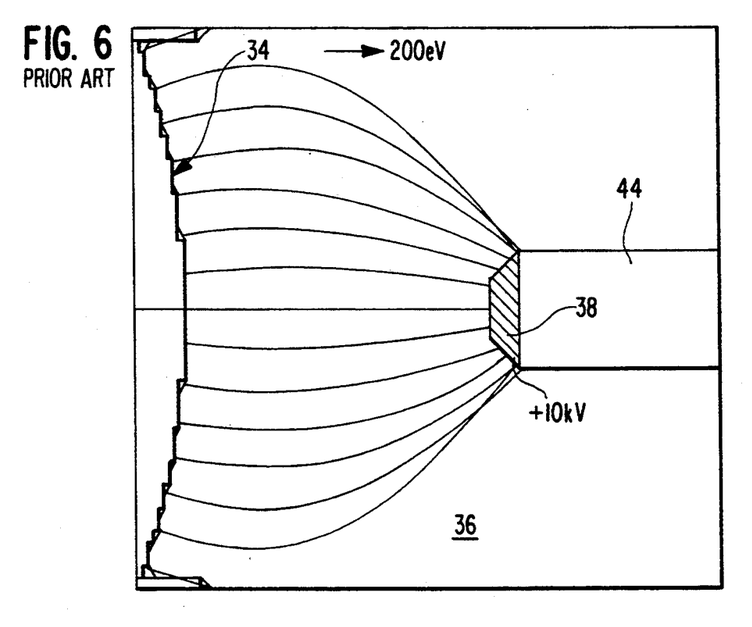
Figure 7:
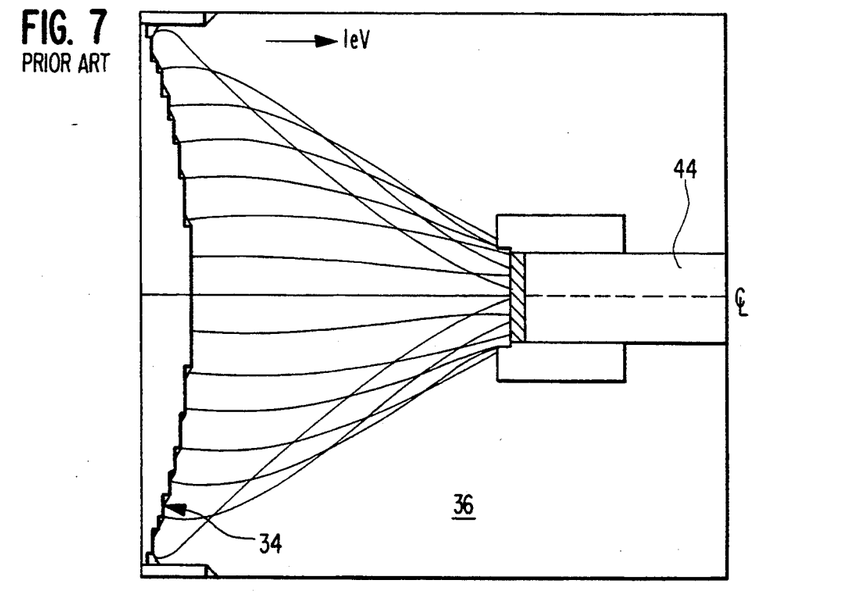
Figure 8:
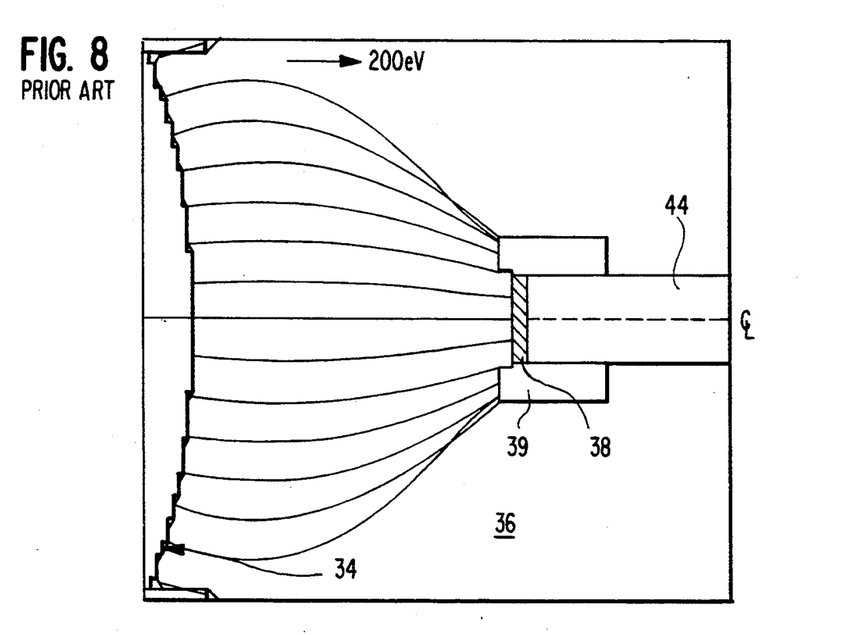

In the detector system 30 illustrated in FIGS. 1-4 and discussed above, it can be difficult to cause the LLEs exiting from grid 34 to contact the desired section, e.g., the most sensitive section, of electron detector 38. FIGS. 5 and 6 show calculated electron trajectories for 1 eV and 200 eV electrons, respectively, exiting from grid 34 and traversing the cavity 36 of FIG. 3. FIGS. 7 and 8 show corresponding electrons traversing cavity 36 of FIG. 4. It will be appreciated from an examination of FIGS. 5 through 8 that, as the electron energy level increases, the electrons traversing cavity 36 strike electron detector 38 further along the sides of electron detector 38. It will also be apparent that, if the LLEs land on metallic ring 39 of FIG. 8 or on the light guide 44 beyond the scintillator 38 of FIG. 6, the electron collection efficiency will be zero.

SUMMARY OF THE INVENTION

The principal object of the present invention is to provide a low-loss electron operated scanning electron microscope having increased electron detector efficiency.

It is a further object of the present invention to provide a detector for a LLE operated SEM having increased electron detection efficiency but having a cost comparable to that of a conventional detector.

These and other objects, features and advantages of the present invention are provided by a detector system for a scanning electron microscope providing a focused primary electron beam and producing backscattered electrons having a plurality of energy levels by interactions with a specimen disposed within the primary electron beam, the backscattered electrons being substantially disposed within a solid angle determined by an angular relationship between the specimen and the primary electron beam. The detector system of the present invention comprises a plurality of grids, each disposed substantially perpendicular to the axis of rotation of the solid angle to permit the backscattered electrons to pass through the grids on a trajectory substantially perpendicular to at least one surface of the grids, wherein each of the grids has a corresponding predetermined potential, and wherein the grids; selectively filter the backscattered electrons so as to permit collection of low loss electrons having at least a predetermined threshold energy level at an exit side of the grids; focusing means disposed opposing the exit side of the grids for focusing the low loss electrons so as to produce convergence of the low loss electrons in a convergence region; and electron detector means disposed in the convergence region for detecting the low loss electrons. The electron detector means is maintained at a predetermined detector potential while the focusing means is maintained at a predetermined focusing potential. According to one aspect of the present invention, the detector and the focusing potentials are equal to one another.

These and other features and advantages of the present invention are provided by a method for detecting a plurality of low loss electrons produced by a scanning electron microscope producing a focused primary electron beam striking a specimen and producing backscattered electrons having at least one predetermined energy level by transmitting selected ones of a plurality of backscattered electrons having a plurality of energy levels produced by interactions of the primary electron beam with the specimen, the low loss electrons being substantially disposed within a solid angle determined by an angular relationship between the specimen and the primary electron beam, the method comprising the steps of providing a focusing means for focusing the low loss electrons so as to produce convergence of the low loss electrons in a convergence region; and locating an electron detector means for detecting the low loss electrons in the convergence region.

In an illustrative embodiment of the present invention, a detector system comprises at least one grid for filtering backscattered electrons to proved low loss electrons, an election detector for detecting low loss electrons, and a focusing grid located between the filter grid and the electron detector for producing convergence of the low loss electrons in a region corresponding to the active detection area of the electron detector. Although the focusing grid and the electron detector advantageously can be electrically coupled, they are physically separate to provide optimum formation of the conveyance region.

These and other objects, features and advantages of the invention are disclosed in or apparent from the following description of preferred embodiments.

BRIEF DESCRIPTION OF THE DRAWINGS

The preferred embodiments are described with reference to the drawings, in which like or similar elements are denoted throughout by like numbers, and in which.

DESCRIPTION OF THE PREFERRED EMBODIMENTS

Figure 9:
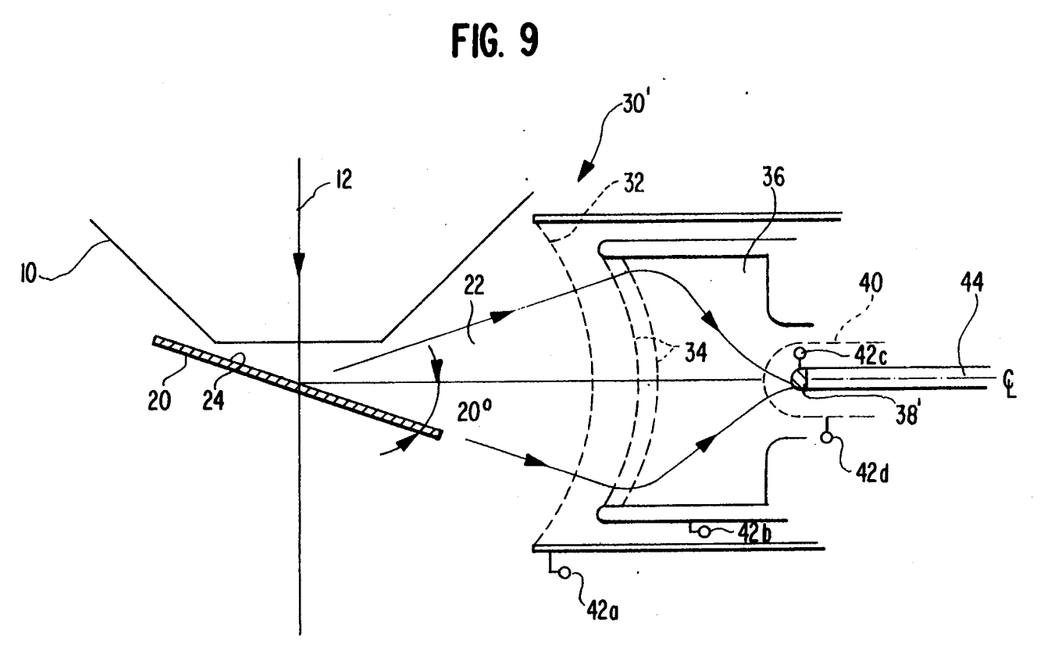
FIG. 9 is a illustrative diagrammatic view of a detector system according to a preferred embodiment of the present invention.

FIG. 9 illustrates the preferred embodiment according to the present invention of a detector system 30' for a LLE operated SEM, which includes the primary electron beam source, electron column 10, providing a primary electron beam 12 to a specimen 20 disposed in the beam 12. Detector system 30' comprises a plurality of charged grids including an input grid 32 and at least one filter grid, generally denoted 34, and a cavity 36 in which both an electron detector 38' and a focusing grid 40 are located. Preferably, focusing grid 40 is provided as a wire mesh screen, whose cross sectional area is several times that of the active area of electron detector 38'. In an illustrative case, grid 40 is about 5 times larger in area than the active area of detector 38'. It will be apparent that other configurations of grid 40 providing an electron porous structure advantageously can be incorporated in the present invention. It will also be appreciated that grid 40 is disposed in cavity 36 between opposing potions of filter grid 34 and electron detector 38'. Grids 32, 34 and electron detector 38' are insulated to withstand potentials which can differ by several kilovolts and advantageously are provided with connectors, generally denoted 42. Focusing grid 40 advantageously is provided with a connector 42d. Conventional power supplies (not shown) can be applied to maintain grids 32, 34 and 40 and electron detector 38' at a plurality of predetermined potentials, which are discussed in detail below.

LLEs entering cavity 36 from the exit side of filter grid 34 are accelerated towards electron detector 38', e.g., a scintillator 38', via focusing grid 40 by a predetermined detector potential applied to electron detector 38' and a predetermined focusing potential applied to grid 40. It will be apparent that focusing grid 40 provides a means for focusing LLEs while detector 38' provides a means for detecting LLEs in the preferred embodiment of the present invention. Preferably, electron detector 38' is connected to a conventional photomultiplier (not shown) via a conventional light guide 44.

The operation of detector system 30' will now be explained while referring to both FIGS. 10 and 11.

It will be appreciated that grids 32 and 34 each have a corresponding potential applied and that it is principally the potential of the filter grid 34 that determines the threshold energy level of the electrons entering the cavity 36. Thus, grids 32 and 34 cooperatively provide a retarding-field energy filter means for allowing passage or transmission of electrons having at least a predetermined threshold energy level, e.g., LLEs, into cavity 36. Electrons entering cavity 36 are accelerated towards electron detector 38' by a potential, which is positive with respect to grid 34.

Computer simulations have demonstrated that the LLE trajectories, after passing through the surface of the positively charged conventional electron detector 38, e.g., entering an assumed field-free region, converge and pass through a disk of least confusion, e.g., a convergence region. This effect is illustrated in FIG. 11. The computer simulations have also shown that for a given diameter of electron detector 38, the convergence region is significantly smaller in diameter. In the portion of the preferred embodiment of the present invention shown in FIG. 10, the conventional electron detector 38 is replaced by a focusing grid 40 and electron detector 38', where the focusing grid 40 can either be located in the position previously occupied by conventional electron detector 38 or can be of a larger size. Thus, by providing the focusing grid 40 between filter grids 32, 34 and electron detector 38', LLEs which would previously have impacted the less sensitive sides of conventional electron detector 38 are directed onto a smaller, more sensitive region of electron detector 38'.

Preferably, focusing grid 40 is a wire mesh screen maintained at a positive predetermined focusing potential relative to grid 34. The predetermined focusing potential and the predetermined detector potential advantageously can be made equal to one another. It will be appreciated that the use of equal potentials eliminates the need for separate control circuits and, thus, allows the detector system 30' to be provided at only a small increase in cost over conventional detector system 30.

It will be apparent from the discussion of the preferred embodiment of the present invention that the focusing means increases the effective size of the electron detector means thereby increasing the attraction for LLEs exiting the exit side of the grids. It will also be appreciated that the focusing means advantageously focuses the LLEs onto a smaller portion of the detector means.

Throughout the above discussions of the background of the invention and the preferred embodiment of the present invention, the electron detectors 38, 38' have been assumed to be conventional scintillators connected to conventional photomultipliers via conventional light guides. It will be appreciated that other electron detector configurations advantageously can be provided without departing for the teachings of the present invention. For example, a luminescent-type material layer operatively coupled to a light detector, a solid-state diode, an electron multiplier, a channel plate, and an electrode operatively coupled to an amplifier advantageously can be used in place of the scintillator to provide electron detection means in the present invention.

Figure 10:
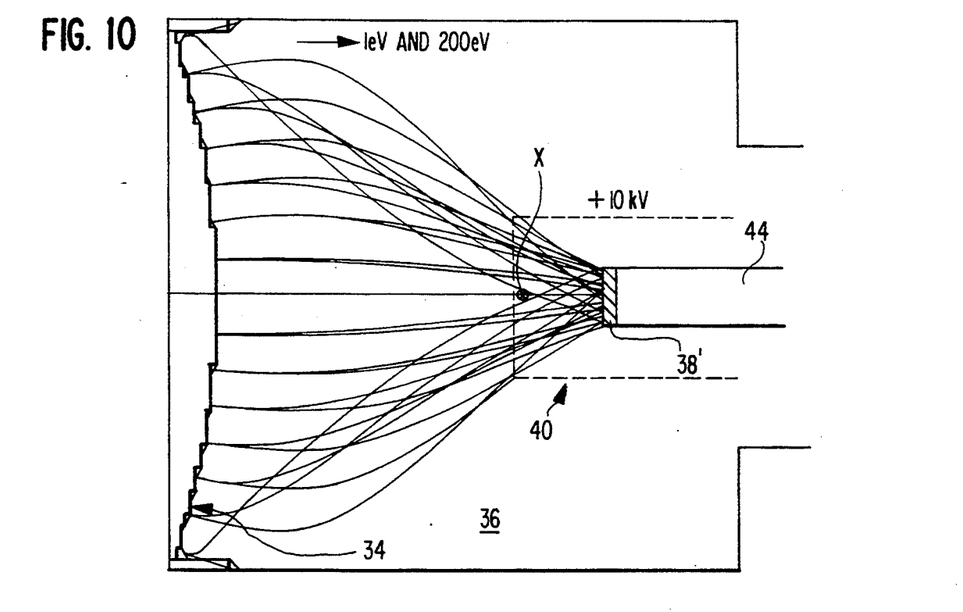
FIG. 10 is an expanded view of a portion of the detector system shown in FIG. 9.
Figure 11:
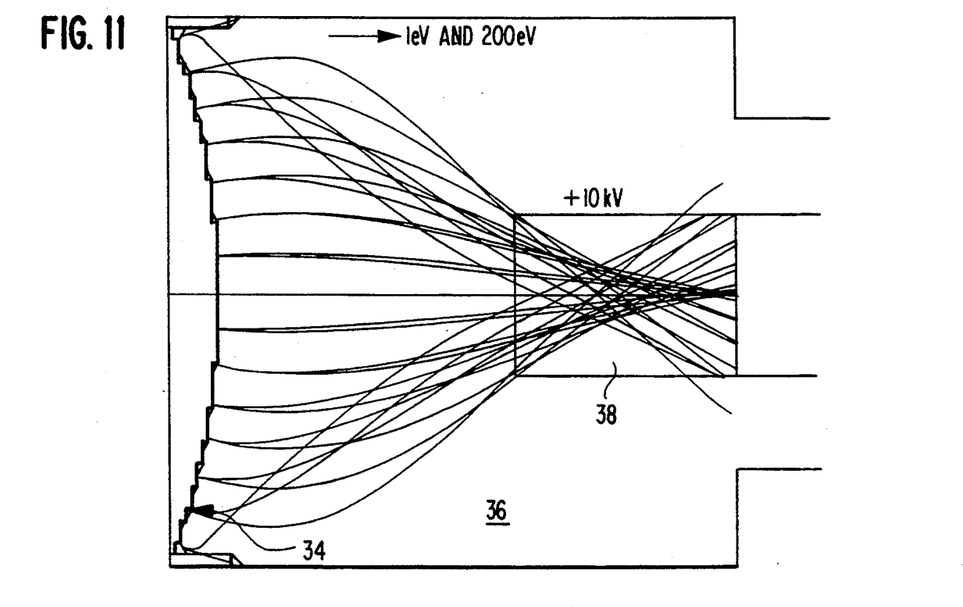
FIG. 11 shows calculated electron trajectories for electrons traversing the cavity of the portion of the detector system of FIG. 10.

It will be noted that in FIG. 10 there is a point marked X that is the point closest to the energy filtering grid 34 at which the computed electron trajectories cross the axis. If the collector 38' is placed closer to grid 34 than crossover point X (while still being inside the focusing grid 40) then it is possible to divide 38' into 2 or more sections so as to provide multiple outputs where each output corresponds to a different part of the collector solid angle 22.

Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A detector system for a scanning electron microscope providing a focused primary electron beam and producing backscattered electrons having a plurality of energy levels by interactions with a specimen disposed within the primary electron beam, the backscattered electrons being substantially located in a solid angle determined by an angular relationship between the specimen and the primary electron beam, said detector system comprising:
    filter means, disposed substantially perpendicular to the axis of rotation of the solid angle to permit said backscattered electrons to pass through said filter means on a trajectory perpendicular to a surface of said filter means and having at least one grid maintained at a predetermined potential, for filtering said backscattered electrons so as to permit low loss electrons to exit said filter means;
    electron detector means for detecting said low loss electrons, said electron detector means being positioned substantially within a convergence region of said low loss electrons; and
    focusing means located between said filter means and said electron detector means and outside of said convergence region for focusing said low loss electrons so as to produce convergence of said low loss electrons in said convergence region.

2. The detector system of claim 1, wherein said electron detector means has a predetermined detector potential and wherein said focusing means has a predetermined focusing potential.

3. The detector system of claim 2, wherein said detector and focusing potentials are equal to one another.

4. The detector system of claim 1, wherein said electron detector means is a luminescent-type material layer.

5. The detector system of claim 1, wherein said electron detector means is solid-state diode.

6. The detector system of claim 1, wherein said electron detector means is an electron multiplier.

7. The detector system of claim 1, wherein said electron detector means is a channel plate.

8. The detector system of claim 1, wherein said electron detector means is an electrode.

9. The detector system of claim 1, wherein said electron detector means is a scintillator.

10. The detector system of claim 1, wherein said focusing means is a wire mesh screen located between said filter means and said electron detector.

11. The detector system of claim 10, wherein said focusing means is electrically coupled to said electron detector means.

12. The detector system of claim 1, wherein said electron detector means has a plurality of sections.

13. The detector system of claim 12, wherein each of said plurality of sections are electrically isolated from each other.

14. A detector system for a scanning electron microscope providing a focused primary electron beam and producing backscattered electrons having a plurality of energy levels by interactions with a specimen disposed within the primary electron beam, the backscattered electrons being substantially disposed within a solid angle determined by an angular relationship between the specimen and the primary electron beam, said detector system comprising:
    a plurality of grids, each of said grids being disposed substantially perpendicular to the axis of rotation of the solid angle to permit said backscattered electrons to pass through said filter means on a trajectory substantially perpendicular to a surface of said filter means and having a corresponding predetermined potential, wherein said grids selectively filter the backscattered electrons to permit collection of low loss electrons having at least a predetermined threshold energy level at an exit side of said grids;
    focusing means disposed opposing said exit side of said grids for focusing said low loss electrons so as to produce convergence of said low loss electrons in a convergence region having a crossed sectional area opposing said focusing means, wherein said focusing means is disposed outside of said convergence region; and
    electron detector means located substantially within said convergence region for detecting said low loss electrons.

15. The detector system of claim 14, wherein said electron detector means has a predetermined detector potential and wherein said focusing means has a predetermined focusing potential.

16. The detector system of claim 15, wherein said detector and said focusing potentials are equal to one another.

17. The detector system of claim 14, wherein said electron detector means is a scintillator.

18. The detector system of claim 14, wherein said electron detector means is a luminescent-type material layer.

19. The detector system of claim 14, wherein said electron detector means is a solid-state diode.

20. The detector system of claim 14, wherein said electron detector means is an electron multiplier.

21. The detector system of claim 14, wherein said electron detector means is a channel plate.

22. The detector system of claim 14, wherein said electron detector means is an electrode.

23. The detector system of claim 14, wherein said predetermined threshold energy level of said low loss electrons corresponds to a predetermined energy loss with respect to said primary electron beam.

24. The detector system of claim 23, wherein said predetermined energy loss is about 1%.

25. The detector system of claim 23, wherein said predetermined energy loss is less than about 5%.

26. The detector system of claim 23, wherein said predetermined energy loss is about 200 eV.

27. The detector system of claim 14, wherein said electron detector means has a plurality of sections.

28. The detector system of claim 27, wherein each of said plurality of sections are electrically isolated from each other.

29. A method for detecting a plurality of low loss electrons produced by a scanning electron microscope producing a focused primary electron beam striking a specimen and producing backscattered electrons having at least one predetermined energy level by transmitting selected ones of a plurality of backscattered electrons having a plurality of energy levels produced by interactions of the primary electron beam with the specimen, the low loss electrons being substantially disposed within a solid angle determined by an angular relationship between the specimen and the primary electron beam, said method comprising the steps of:

provide a focusing means for focusing the low loss electrons so as to produce convergence of the low loss electrons in a convergence region, said focusing means being provided outside of said convergence region; and locating an electron detector means for detecting the low loss electrons in said convergence region.

30. The method of claim 29, said method further comprising the steps of:

controlling a potential applied to said focusing means at a predetermined focusing potential; and controlling a potential applied to said electron detector means at a predetermined detector potential.

31. The method of claim 30, wherein predetermined focusing potential and predetermined detector potential are equal to one another.

32. The method of claim 29, wherein said electron detector means has a plurality of sections.

* * * * *